United States Patent
Tamura

(10) Patent No.: US 8,964,899 B2
(45) Date of Patent: Feb. 24, 2015

(54) RECEIVING CIRCUIT

(71) Applicant: Fujitsu Limited, Kawasaki (JP)

(72) Inventor: Hirotaka Tamura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 135 days.

(21) Appl. No.: 13/660,652

(22) Filed: Oct. 25, 2012

(65) Prior Publication Data

US 2013/0162309 A1 Jun. 27, 2013

(30) Foreign Application Priority Data

Dec. 27, 2011 (JP) ................... 2011-286245

(51) Int. Cl.
*H03K 9/00* (2006.01)
*H04L 27/00* (2006.01)

(52) U.S. Cl.
USPC .......... 375/316; 375/354; 375/373; 375/374; 375/375; 375/376

(58) Field of Classification Search
USPC .................. 375/316, 354, 373, 374, 375, 376
See application file for complete search history.

(56) References Cited

U.S. PATENT DOCUMENTS

| | | | |
|---|---|---|---|
| 6,999,544 B2 * | 2/2006 | Cranford et al. | 375/360 |
| 7,499,511 B2 * | 3/2009 | Okamura | 375/355 |
| 7,973,691 B2 | 7/2011 | Yamaguchi et al. | |
| 8,120,395 B2 * | 2/2012 | Williams et al. | 327/156 |
| 8,699,647 B2 * | 4/2014 | Wenske et al. | 375/355 |
| 2004/0042544 A1 * | 3/2004 | Mejia | 375/225 |
| 2009/0213973 A1 * | 8/2009 | Yanagidate | 375/371 |
| 2010/0127906 A1 | 5/2010 | Yamaguchi et al. | |
| 2010/0202578 A1 * | 8/2010 | Tomita et al. | 375/371 |
| 2010/0296615 A1 * | 11/2010 | Wei | 375/376 |
| 2012/0008727 A1 * | 1/2012 | Mohajeri et al. | 375/376 |
| 2012/0140811 A1 * | 6/2012 | Shibasaki | 375/229 |
| 2012/0200325 A1 * | 8/2012 | Werner | 327/156 |

FOREIGN PATENT DOCUMENTS

JP 2010-130366 A 6/2010

* cited by examiner

*Primary Examiner* — Freshteh N Aghdam
(74) *Attorney, Agent, or Firm* — Arent Fox LLP

(57) ABSTRACT

Disclosed is a receiving circuit which includes: a data selection circuit selecting two input data located while placing in between the center phase of one unit interval of a binary input data; a correction circuit correcting the two input data selected by the data selection circuit; a phase detection circuit detecting a phase at which the level of input data changes as a boundary phase in the one unit interval, based on the two input data corrected by the correction circuit; an arithmetic unit calculating the center phase, based on the boundary phase detected by the phase detection circuit; and data decision circuit determining and outputting the level of one of the two input data, based on the center phase and the boundary phase, the correction circuit implements the correction based on a correction value corresponded to the past data level output by the data decision circuit.

7 Claims, 15 Drawing Sheets

F I G. 10
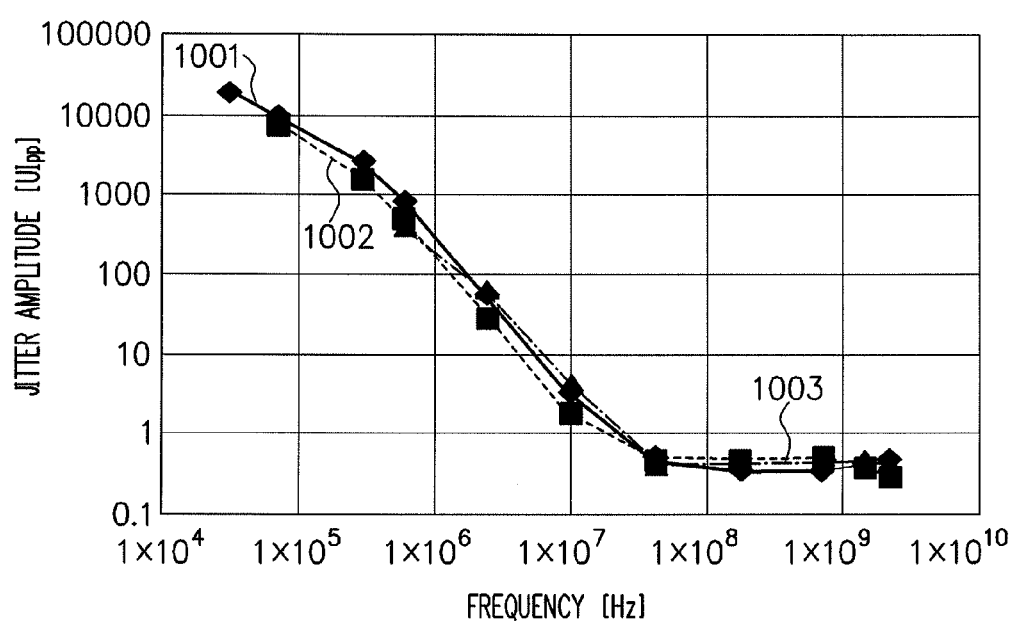

F I G. 14
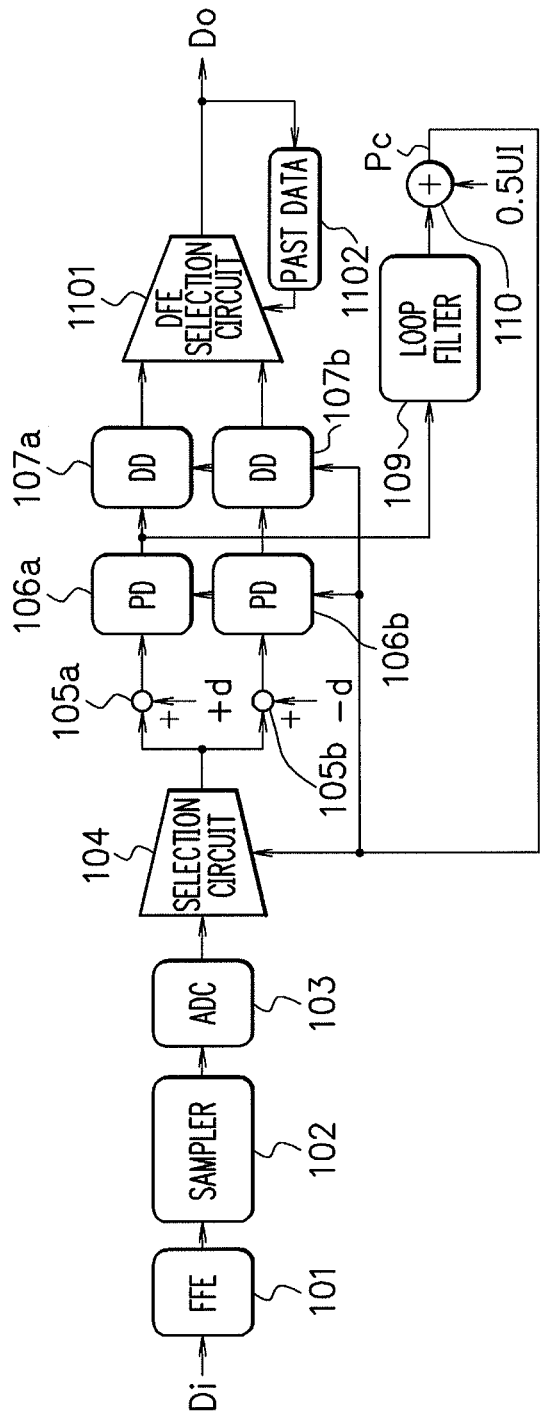

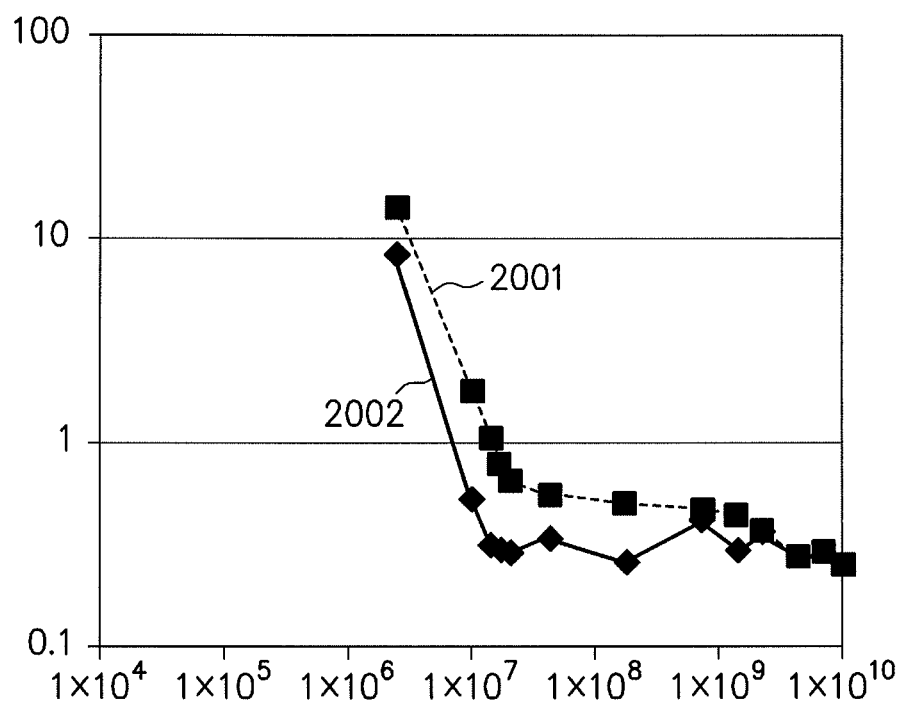
F I G. 20

RECEIVING CIRCUIT

CROSS-REFERENCE TO RELATED APPLICATION

This application is based upon and claims the benefit of priority of the prior Japanese Patent Application No. 2011-286245, filed on Dec. 27, 2011, the entire contents of which are incorporated herein by reference.

FIELD

The present invention relates to a receiving circuit.

BACKGROUND

Performances of components composing computers and other information processing equipment have made great advancement, as seen in memory, processor and switching LSI (large-scale integrated circuit). In view of improving system performances, it is necessary to improve not only performances of the individual components, but also signal transmission rate between these components or elements (increase in transmission capacity and reduction in transmission delay). For example, improvement in performances of computer (server) needs improvement in the signal transmission rate between a memory, such as SRAM (static random access memory) or DRAM (dynamic random access memory), and a processor, and signal transmission rate between servers. Besides the servers, with the progress in performances of information processing equipment including those for backbone system of communication, there has been a growing need of increasing data rate in signal transmission inside and outside the equipment.

In recent years, in addition to a demand on increase in the data rate, there has been a further demand of implementing such higher data rate at a low power consumption. In order to respond to the requirements of higher data rate and lower power consumption, not a few integrated circuits have encountered need for increasing the data rate of an input/output circuit (I/O) from several gigabits/second to several tens gigabits/second. For advanced equipment, it is also necessary to integrate a large number of I/O ports compatible to such large data rate into a single integrated circuit. High speed I/O needs a large number of analog circuits including equalizer, timing generator and so forth. From the viewpoints of readiness in design and integration of a large number of I/Os, it is preferable to replace these analog circuits with digital circuits.

There has been known a data decoding circuit which includes an analog-digital converter converting input analog signals expressing a data stream into digital signals in synchronization with a clock signal, to thereby generate a digital code stream obtained by sampling with intervals shorter than data intervals of the data stream; a phase detector calculating a position of cross point at which a line segment obtained by interpolating the digital data stream crosses the horizontal line expressing the level of predetermined code value, lying approximately at the center of a possible range of values of digital codes; a phase estimation unit determining an estimated position of the center point of the data stream based on the position of the cross point; and a data decision unit extracting a stream of decided data value from the digital data stream, based on the position of the cross point and the estimated position of the center point of the data stream (see Patent Document 1).

[Patent Document 1] Japanese Laid-Open Patent Publication No. 2010-130366

SUMMARY

According to the present invention, there is provided a receiving circuit which includes: a data selection circuit selecting two input data located while placing in between the center phase of one unit interval of a binary input data; a correction circuit correcting the two input data selected by the data selection circuit; a phase detection circuit detecting a phase at which the level of input data changes as a boundary phase in the one unit interval, based on the two input data corrected by the correction circuit; an arithmetic unit calculating the center phase of the one unit interval, based on the boundary phase detected by the phase detection circuit; and data decision circuit determining and outputting the level of one of the two input data, based on the center phase and the boundary phase. The data selection circuit selects the two input data based on the center phase calculated by the arithmetic unit. The correction circuit corrects the two input data based on a correction value corresponded to the past data level output by the data decision circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10 is a drawing illustrating other results of simulation of the receiving circuit;

FIG. 14 is a drawing illustrating an exemplary configuration of a receiving circuit of a fourth embodiment;

FIG. 20 is a drawing illustrating results of simulation of a receiving circuit of a fifth embodiment.

DESCRIPTION OF EMBODIMENTS

First Embodiment

Figure 1:
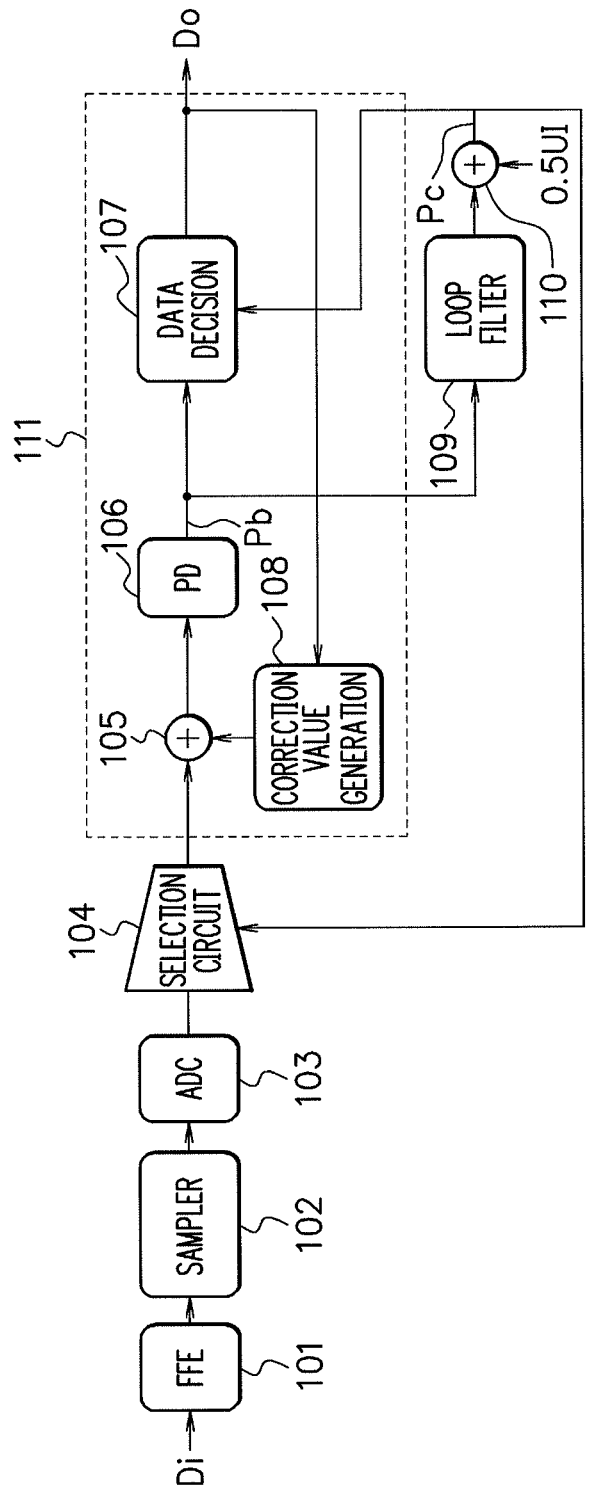
FIG. 1 is a drawing illustrating an exemplary configuration of a receiving circuit of a first embodiment.

FIG. 1 is a drawing illustrating an exemplary configuration of a receiving circuit of a first embodiment. The receiving circuit is typically used for signal transmission between LSI chips, signal transmission between a plurality of circuit blocks in a package, and signal transmission between the packages, and is featured by high-speed transmission. The receiving circuit receives binary data through a transmission line from a transmitting circuit.

The receiving circuit has a clock data recovery (CDR) circuit, and decodes output data Do based on input data Di. An decision feedback equalizer (DFE) 111 has a correction circuit 105, a phase detection circuit 106, a data decision circuit 107, and a correction value generating circuit 108.

The equalizer 101 is a feed-forward equalizer (FFE), and removes distortion in waveform of input data, which is ascribable to the transmission line, by equalizing the binary input data Di corresponding to transmission characteristics of the transmission line. The sampler 102 samples data output by the equalizer 101, in synchronization with a clock signal which is asynchronous to a clock signal of the transmitting circuit.

Figure 2A:
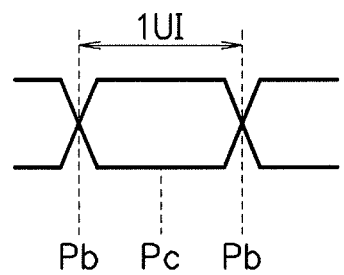
FIG. 2A is a drawing illustrating a change in a binary input data.

FIG. 2A is a drawing illustrating a change in the binary input data Di. One unit interval (1 UI) means a duration of one bit data, and the one unit interval of the individual bit data is almost constant. Boundary phase Pb is a phase which appears at the boundary of the adjacent unit intervals, at which the level of input data Di may change. Center phase Pc means a phase at the center of one unit interval (1 UI), and has a phase difference of 0.5 unit intervals away from the boundary phase Pb. The input data Di is a NRZ (non-return-to-zero) binary data, at a transmission rate of 2.5 Gbits/sec, for example.

The sampler 102 illustrated in FIG. 1 typically samples two sample data per one unit interval (double over sampling). The analog-digital converter 103 converts the analog data sampled by the sampler 102 into digital data. For example, the analog-digital converter 103 is a 4-bit, analog-digital converter, performing digital conversion at a sampling rate of 5 gigasamples per second.

The data selection circuit 104 receives center phase Pc from an adder 110, and selects two input data located while placing in between the center phase Pc of one unit interval of digital data resulted from conversion by the analog-digital converter 103. The correction circuit 105 is typically an adder, which receives a correction value from the correction value generating circuit 108, and corrects the input data by adding the input data selected by the data selection circuit 104 and the correction value.

The phase detection circuit 106 detects a phase at which the level of input data changes as a boundary phase Pb in the one unit interval, based on the input data corrected by the correction circuit 105. A loop filter 109 is a low-pass filter, smoothens the boundary phase Pb, and outputs the smoothened boundary phase. The adder 110 adds 0.5 unit intervals to the output signal of the loop filter 109, and outputs the sum as the center phase Pc of the one unit interval. If the sum is larger than one unit interval, the adder 110 outputs a value obtained by subtracting 1 from the sum. The loop filter 109 may be provided alternatively on the downstream side of the adder 110. It suffices that the arithmetic unit, configured by the loop filter 109 and the adder 110, outputs the center phase Pc after smoothened by the loop filter 109.

The data decision circuit 107 decides the level of either one of the two input data selected by the selection circuit 104 and corrected by the correction circuit 105, based on the center phase Pc and the boundary phase Pb, and outputs the determined level as the output data Do. For example, if the level of data exceeds 0, the data is determined to have a level of "+1", whereas if the level of data is smaller than 0, the data is determined to have a level of "−1".

The data selection circuit 104 implements the selection based on the center phase Pc resulted from addition by the adder 110. The correction value generating circuit 108 generates a correction value corresponded to the past data level output by the data decision circuit 107. For example, the correction value generating circuit 108 has a correction value table, and outputs correction value "+d" if the past data is "−1", whereas outputs correction value "−d" if the past data is "+1". The past data may be one bit, or may be 2 bit or more. The correction circuit 105 adds the input data selected by the data selection circuit 104 and the correction value generated by the correction value generating circuit 108, and outputs the sum to the phase detection circuit 106.

The correction value generating circuit 108 generates the correction value corresponding to the past output data Do of the data decision circuit 107. For example, the correction value is generated using the past output data Do which amounts one bit if the decision feedback equalizer 111 has a single-tap configuration, or using the past output data which amounts two bits if the decision feedback equalizer 111 has a two-tap configuration, and necessarily using $2^m$ correction values for a m-tap configuration. The correction value may preliminarily be determined, or may be optimized by adaptive control.

Figure 2B:
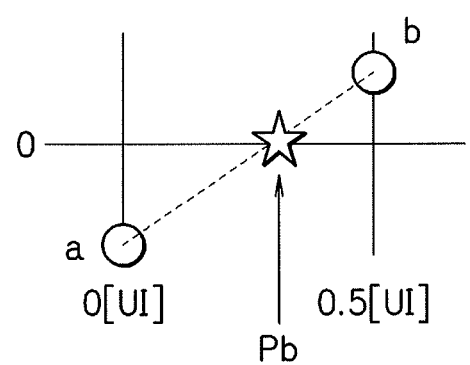
FIG. 2B is a drawing explaining a method of detecting a boundary phase implemented by a phase detection circuit illustrated in FIG. 1.

FIG. 2B is a drawing explaining a method of detecting the boundary phase Pb by the phase detection circuit 106 illustrated in FIG. 1. The input data Di typically has a binary level of "+1" or "−1". The phase detection circuit 106 typically enters adjacent two input data a and b. The input data a has a phase of 0 unit intervals and has a level below 0. The input data b has a phase of 0.5 unit intervals and has a level above 0. The phase detection circuit 106 detects a phase at which change from the input data a to the input data b crosses the level 0, as the boundary phase Pb. More specifically, the phase detection circuit 106 calculates Pb=0.5×a/(a−b) based on linear interpolation, to thereby find the boundary phase Pb [UI].

FIG. 2B showed an exemplary case where the boundary phase Pb resides in the range of unit interval from 0 to 0.5. For the case where the boundary phase Pb is not found in the range of unit interval from 0 to 0.5, the boundary phase Pb in the range of unit interval from 0.5 to 1 is detected.

Figure 3A:
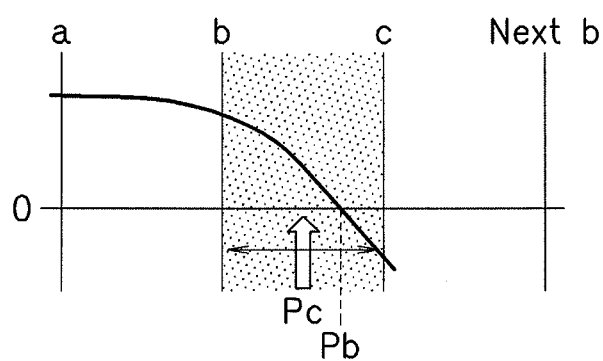
FIGS. 3A and 3B are drawings explaining a method of determining data implemented by a data decision circuit illustrated in FIG. 1.
Figure 3B:
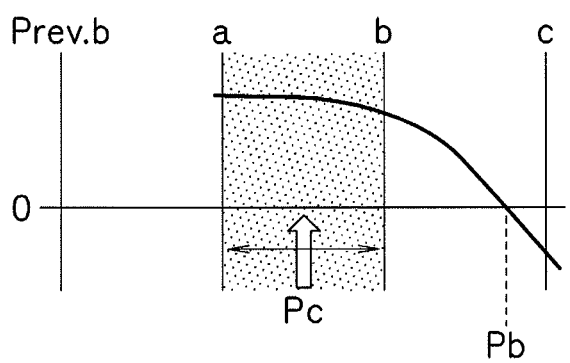

FIGS. 3A and 3B are drawings explaining a method of determining data implemented by the data decision circuit 107 illustrated in FIG. 1. As seen in FIG. 2A, since the level of data may change at around the boundary phase Pb, it is not preferable to decode the data at around the boundary phase Pb. In contrast, the level of data is relatively stable at the center phase Pc, so that it is preferable for the data decision circuit 107 to decode the data based on the data at around the center phase Pc.

In FIG. 3A, the two input data located while placing the center phase Pc in between are the input data b and c, with the boundary phase Pb fallen between the input data b and c. In this case, if the center phase Pc is smaller than the boundary phase Pb, the data decision circuit 107 determines the input data b on the binary basis, and outputs data "+1" or "−1" as decoded data. In contrast, if the center phase Pc is larger than the boundary phase Pb, data decision circuit 107 determines the input data c on the binary basis, and outputs data "+1" or "−1" as the decoded data.

In FIG. 3B, the two input data located while placing the center phase Pc in between are the input data a and b, with the boundary phase Pb fallen between the input data b and c. In this case, since the input data a and b are determined to have the same level, so that the data decision circuit 107 determines either input data a or b on the binary basis, and outputs data "+1" or "−1" as the decoded data.

The data decision circuit 107 may alternatively implement a precise data decision as described below. If the center phase Pc is smaller than the boundary phase Pb as illustrated in FIG. 3B, the data decision circuit 107 determines the input data a on the binary basis, and outputs data "+1" or "−1" as the decoded data. In contrast, if the center phase Pc is larger than the boundary phase Pb, the data decision circuit 107 determines the input data b on the binary basis, and outputs data "+1" or "−1" as the decoded data.

Figure 4:
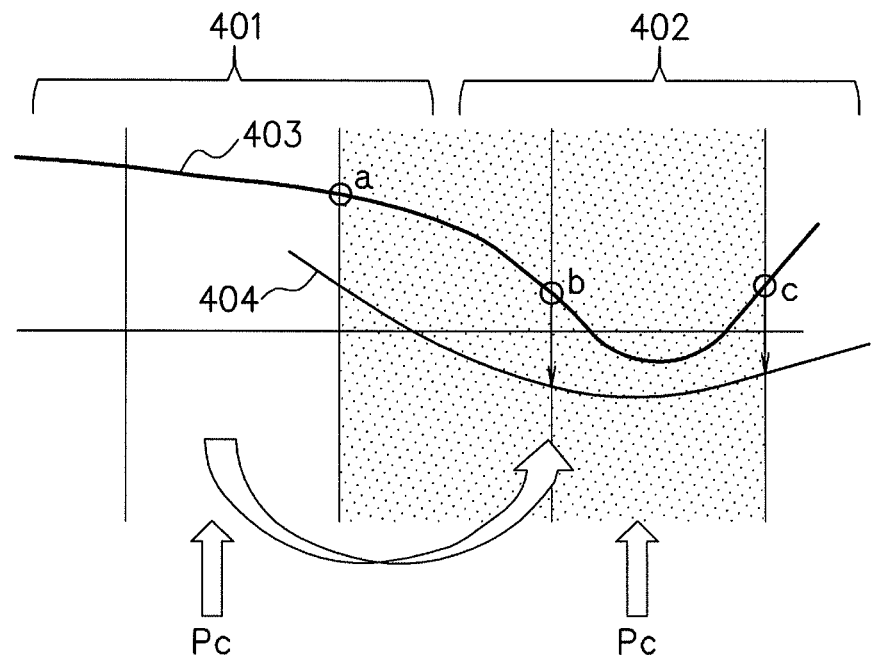
FIG. 4 is a drawing explaining a method of correction implemented by a correction circuit illustrated in FIG. 1.

FIG. 4 is a drawing explaining a method of correction implemented by the correction circuit 105 illustrated in FIG. 1. The input data a, b and c are sampled from input data 403. The correction circuit 105 adds the same correction value to the input data b and c located while placing in between on the center phase Pc in the current one unit interval 402, based on the data of the previous one unit interval 401 (past data), to thereby remove intersymbol interference, and outputs corrected data 404. The correction values added to the input data b and c are same.

Figure 5:
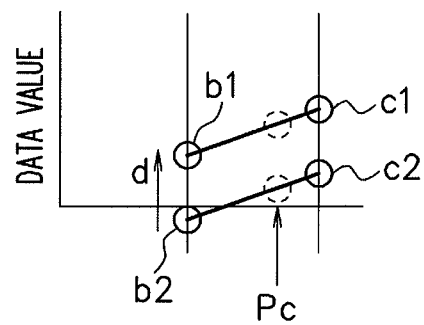
FIG. 5 is another drawing explaining a method of correction implemented by the correction circuit illustrated in FIG. 1.

FIG. 5 is another drawing explaining a method of correction implemented by the correction circuit 105 illustrated in FIG. 1. The correction circuit 105 adds correction value "−d" respectively to uncorrected input data b1 and c1, and outputs the corrected input data b2 and c2. For the case where the center phase Pc (boundary phase Pb) is determined by linear interpolation by the phase detection circuit 106, under the double oversampling by the sampler 102, the linear interpolation will be accurate when the impulse response is given as a square wave with a width of one unit interval. If the linear interpolation is accurate, addition of the same correction value "−d" to the input data b1 and c1 at both ends of the interval, is equivalent to addition of the correction value to the data at the center phase Pc.

Figure 6:
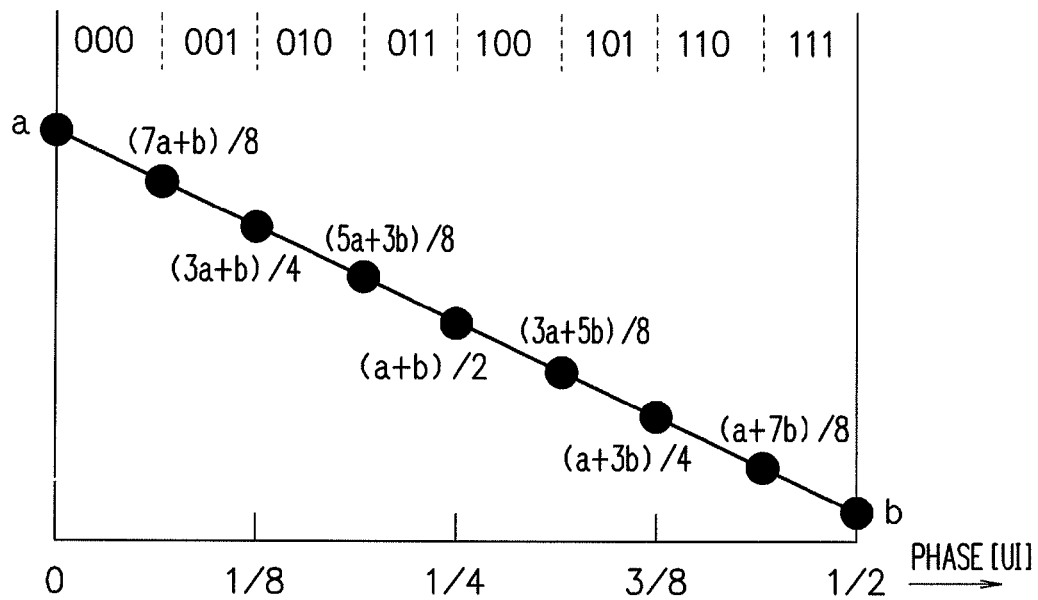
FIG. 6 is another drawing explaining a method of phase detection implemented by the phase detection circuit illustrated in FIG. 1.

FIG. 6 is a drawing explaining another method of phase detection implemented by the phase detection circuit 106 illustrated in FIG. 1. The input data a has the phase of 0 unit intervals. The input data b has the phase of ½ (=0.5) unit intervals. The level of the input data a has a positive value, and the level of the input data b has a negative value, for example. The linear interpolation is now given between the input data a and the input data b.

Now a represents the level of the input data a, and b represents the level of the input data b. The level at level 0 [UI] is a, the level at 1/16 [UI] is (7a+b)/8, the level at 2/16 [UI] is (3a+b)/4, the level at 3/16 [UI] is (5a+3b)/8, the level at 4/16 [UI] is (a+b)/2, the level at 5/16 [UI] is (3a+5b)/8, the level at 6/16 [UI] is (a+3b)/4, the level at 7/16 [UI] is (a+7b)/8, and the level at 8/16 [UI] is b.

If a and (7a+b)/8 have different signs, the phase detection circuit 106 outputs, as the boundary phase Pb, a phase code "000" which indicates that the boundary phase Pb falls in the range from 0 to 1/16 [UI].

If (7a+b)/8 and (3a+b)/4 have different signs, the phase detection circuit 106 outputs, as the boundary phase Pb, a phase code "001" which indicates that the boundary phase Pb falls in the range from 1/16 to 2/16 [UI].

If (3a+b)/4 and (5a+3b)/8 have different signs, the phase detection circuit 106 outputs, as the boundary phase Pb, a phase code "010" which indicates that the boundary phase Pb falls in the range from 2/16 to 3/16 [UI].

If (5a+3b)/8 and (a+b)/2 have different signs, the phase detection circuit 106 outputs, as the boundary phase Pb, a phase code "011" which indicates that the boundary phase Pb falls in the range from 3/16 to 4/16 [UI].

If (a+b)/2 and (3a+5b)/8 have different signs, the phase detection circuit 106 outputs, as the boundary phase Pb, a phase code "100" which indicates that the boundary phase Pb falls in the range from 4/16 to 5/16 [UI].

If (3a+5b)/8 and (a+3b)/4 have different signs, the phase detection circuit 106 outputs, as the boundary phase Pb, a phase code "101" which indicates that the boundary phase Pb falls in the range from 5/16 to 6/16 [UI].

If (a+3b)/4 and (a+7b)/8 have different signs, the phase detection circuit 106 outputs, as the boundary phase Pb, a phase code "110" which indicates that the boundary phase Pb falls in the range from 6/16 to 7/16 [UI].

If (a+7b)/8 and b have different signs, the phase detection circuit 106 outputs, as the boundary phase Pb, a phase code "111" which indicates that the boundary phase Pb falls in the range from 7/16 to 8/16 [UI].

Note that, for the case where the boundary phase Pb falls in the range from 0.5 to 1 [UI], the boundary phase Pb may be detected by linear interpolation over the range from 0.5 to 1 [UI], similarly as described in the above.

Figure 7:
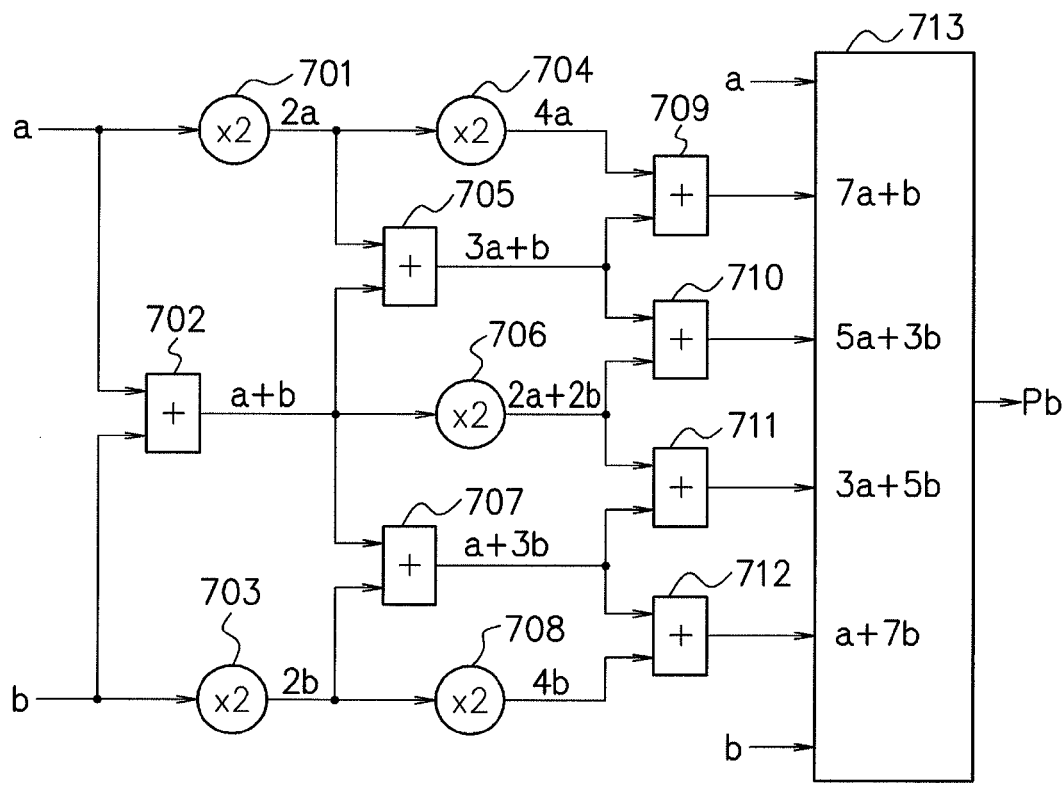
FIG. 7 is a drawing illustrating an exemplary configuration for implementing the phase detection circuit illustrated in FIG. 6.

FIG. 7 is a drawing illustrating an exemplary configuration for implementing the phase detection circuit 106 illustrated in FIG. 6. A multiplier 701 doubles a, and outputs 2a. An adder 702 adds a and b, and outputs a+b. A multiplier 703 doubles b, and outputs 2b. A multiplier 704 doubles 2a, and outputs 4a. An adder 705 adds 2a and a+b, and outputs 3a+b. A multiplier 706 doubles a+b, and outputs 2a+2b. An adder 707 adds a+b and 2b, and outputs a+3b. A multiplier 708 doubles 2b, and outputs 4b. An adder 709 adds 4a and 3a+b, and outputs 7a+b. An adder 710 adds 3a+b and 2a+2b, and outputs 5a+3b. An adder 711 adds 2a+2b and a+3b, and outputs 3a+5b. An adder 712 adds a+3b and 4b, and outputs a+7b. A detector 713 outputs the boundary phases Pb having codes of "000" to "111" according to the method illustrated in FIG. 6, based on the signs of a, 7a+b, 5a+3b, 3a+5b, a+7b and b. The multipliers 701, 703, 704, 706, 708 can perform the two-fold multiplication by bit shifting. The detector 713 can detects difference or equality of the signs by exclusive OR operation of sign bits.

Figure 8:
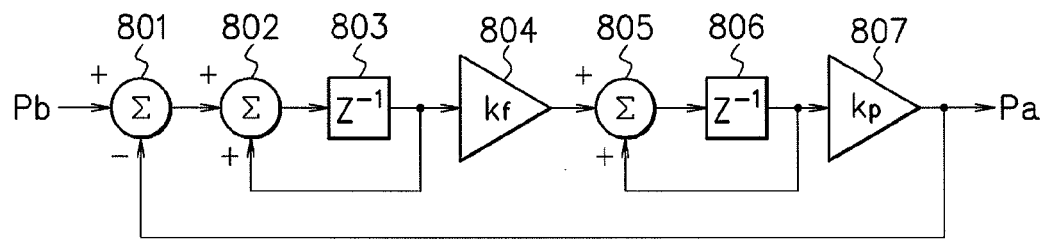
FIG. 8 is a drawing illustrating an exemplary configuration of a loop filter illustrated in FIG. 1.

FIG. 8 is a drawing illustrating an exemplary configuration of a loop filter 109 illustrated in FIG. 1. The loop filter 109 is a quadratic low pass filter having two integrators. A subtractor 801 subtracts average boundary phase Pa from the boundary phase Pb, and outputs the difference. An adder 802 adds the output value of the subtractor 801 and an output value of a delayer 803, and outputs the sum. The delayer 803 delays the output value of the adder 802 by one sample data, and outputs the result. A multiplier 804 multiplies the output value of the delayer 803 and a coefficient kf, and outputs the product. An adder 805 multiplies the output value of the multiplier 804 and an output value of a delayer 806, and outputs the product. The delayer 806 delays the output value of the adder 805 by one sample data, and outputs the result. The multiplier 807 multiplies the output value of the delayer 806 and a coefficient kp, and outputs the average phase Pa to the subtractor 801 and the adder 110 (FIG. 1). Add-subtract operation of the boundary phase Pb is performed using mod $2^m$, while assuming the one [UI] with integers from 0 to $2^m-1$. In other words, the add-subtract operation gives a value of phase subtracted by one [UI], if the value exceeds one [UI].

In order to solve the problem of circuit scale and power consumption of the receiving circuit using the analog-digital converter 103 as illustrated in FIG. 1, it is effective to reduce the number of bits required for the analog-digital converter 103 by modifying the methods of equalizing and data decision. For example, a flash analog-digital converter used for high-speed, analog-digital converter can exponentially reduce the power consumption and occupied space, by reducing the necessary number of bits (halved if reduced by one bit).

One effective method of modifying the method of equalization is to locate the analog equalizer 101 on the upstream side of the analog-digital converter 103, and locate the decision feedback equalizer 111 on the downstream side of the analog-digital converter 103. The configuration having the analog equalizer 101 located on the upstream side of the analog-digital converter 103 is advantageous in that the number of bits required by the analog-digital converter 103 may be reduced, since quantization noise of analog-digital converter 103 will not be amplified by the equalizer 101. By locating the decision feedback equalizer 111 on the downstream side of the analog equalizer 101, the decision feedback equalizer 111 can decode the signal level without amplifying the noise component contained therein, so that the band required for the analog equalizer 101 may be narrowed, and thereby the number of bits required for the analog-digital converter 103 may further be reduced.

This embodiment is configured to make the correction circuit 105 add the correction value to the sample data selected by the data selection circuit 104, without using a circuit explicitly determining a signal value at the center phase Pc, so that an effect of using the decision feedback equalizer, which determines a signal value at the center phase Pc, may be obtained only with a less amount of hardware. By incorporating the decision feedback equalizer 111, performance of equalization may be improved, and thereby performance of the receiving circuit may be improved.

Figure 9:
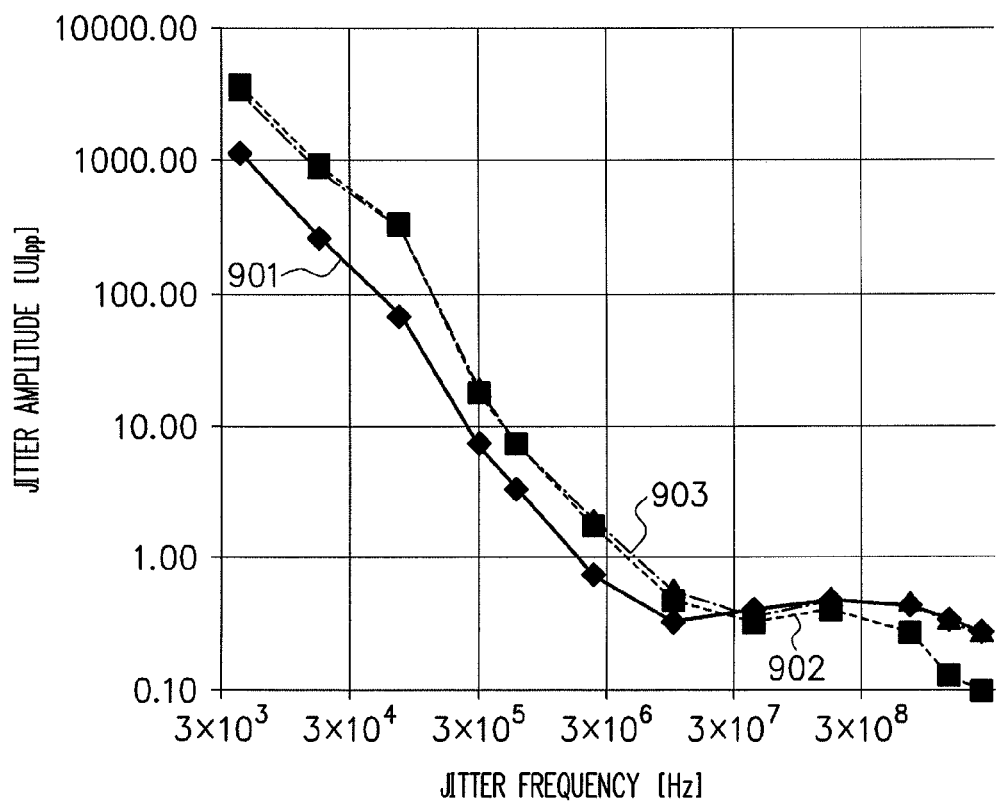
FIG. 9 is a drawing illustrating results of simulation of the receiving circuit.

FIG. 9 is a drawing illustrating results of simulation of the receiving circuit. The receiving circuit uses the sampler 102 to sample the input data according to an asynchronous clock signal. The abscissa represents jitter frequency, and the ordinate represents jitter amplitude. A characteristic curve 903 represents characteristic of the receiving circuit illustrated in FIG. 1. A characteristic curve 902 represents characteristics of a receiving circuit having no decision feedback equalizer 111. A characteristic curve 901 represents characteristics of the receiving circuit using the decision feedback equalizer 111 for determining a signal value at the center phase Pc. It is understood that this embodiment represented by the characteristic curve 903 shows larger jitter resistance at high frequencies as compared with the receiving circuit represented by the characteristic curve 902, and shows characteristics comparable to those of the receiving circuit represented by the characteristic curve 901, according to which a signal value at the center phase Pc is determined using the decision feedback equalizer.

FIG. 10 is a drawing illustrating other results of simulation of the receiving circuit. The abscissa represents jitter frequency, and the ordinate represents jitter amplitude. A characteristic curve 1003 represents characteristics of the receiving circuit illustrated in FIG. 1. A characteristic curve 1002 represents characteristics of an interpolation-type CDR circuit which performs correction using a correction value corresponded to the center phase Pc. A characteristic curve 1001 represents characteristics of a tracking-type CDR circuit which performs synchronization control of sampling clock frequency. It is understood that this embodiment represented by the characteristic curve 1003 may implement performances comparable to those represented by the characteristic curves 1001 and 1002, only with a more simple circuit configuration.

According to this embodiment, by providing the decision feedback equalizer 111, the equalization characteristics may be improved, and the number of bits required for the analog-digital converter 103 may be reduced. Also by virtue of needlessness of the circuit for determining a signal value at the center phase Pc, the hardware amount and power consumption of the receiving circuit may be reduced.

Second Embodiment

Figure 11:
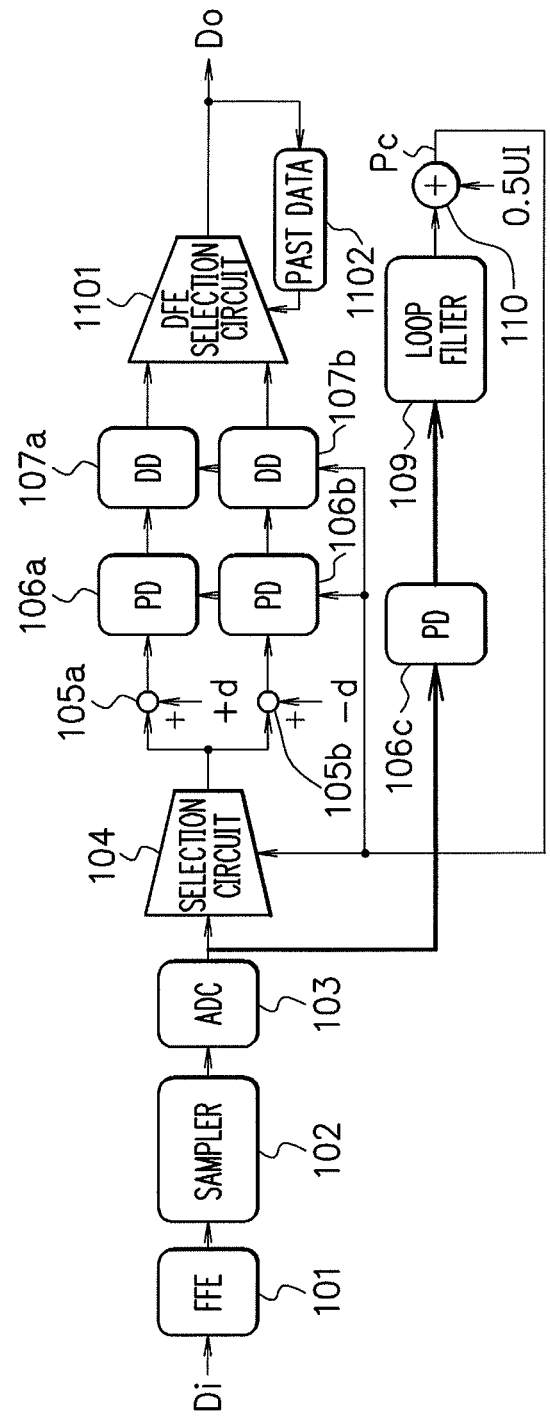
FIG. 11 is a drawing of an exemplary configuration of a receiving circuit of a second embodiment.

FIG. 11 is a drawing illustrating an exemplary configuration of a receiving circuit of a second embodiment. Aspects different from those in the first embodiment will be explained below. Correction units 105a and 105b correspond to the correction circuit 105 illustrated in FIG. 1. The correction unit 105a is an adder, which adds correction value "+d" to the input data selected by the data selection circuit 104, and outputs the corrected input data. The correction unit 105b is an adder, which adds correction value "−d" to the input data selected by the data selection circuit 104, and outputs the corrected input data.

Phase detectors 106a to 106c correspond to the phase detection circuit 106 illustrated in FIG. 1. The phase detector 106a detects a phase at which the level of the input data changes as the boundary phase Pb, based on the input data corrected by the correction unit 105a. The phase detector 106b detects a phase at which the level of the input data changes as the boundary phase Pb, based on the input data corrected by the correction unit 105b. A first phase detector 106c detects a phase at which the level of the input data changes as the boundary phase Pb, based on the input data converted by the analog-digital converter 103, and outputs the boundary phase Pb to the loop filter 109. The loop filter 109 smoothens the boundary phase Pb detected by the first phase detector 106c, and outputs the smoothened boundary phase Pd. The adder 110 adds 0.5 [UI] to the boundary phase output by the loop filter 109, and outputs the center phase Pc.

Data decision units 107a and 107b correspond to the data decision circuit 107 illustrated in FIG. 1. The data decision unit 107a determines the level of either one of the two input data corrected by the correction unit 105a, based on the center phase Pc and the boundary phase Pb detected by the phase detector 106a. Data decision unit 107b determines the level of either one of the two input data corrected by the correction unit 105b, based on the center phase Pc and the boundary phase Pb detected by the phase detector 106b.

An equalizer selection circuit 1101 selects the level of either one of data output by the data decision units 107a and 107b, based on the past data level stored in a storage unit 1102, and outputs data Do. The storage unit 1102 stores the past data composed of one bit or a plurality of bits output by the equalizer selection circuit 1101. The past data composed of one bit may be stored in the storage unit 1102, by providing two sets of correction units 105a, 105b, phase detectors 106a, 106b and data decision units 107a, 107b, as illustrated in FIG. 11.

The past data composed of two or more bits may be stored in the storage unit 1102, by providing three or more sets of correction units 105a, 105b and so forth, phase detectors 106a, 106b and so forth, and data decision units 107a, 107b and so forth. In this case, the plurality of correction units 105a, 105b and so forth correspond to the correction circuit 105 illustrated in FIG. 1, and correct the input data selected by the selection circuit 104, based on a plurality of correction values. The plurality of phase detectors 106a, 106b and so forth correspond to the phase detection circuit 106 illustrated in FIG. 1, and detect phases at which the levels of input data change as the boundary phases Pb, based on the input data corrected by the plurality of correction units 105a, 105b and so forth. The plurality of data decision units 107a, 107b and so forth correspond to the data decision circuit 107 illustrated in FIG. 1, determine the levels of either ones of the two input data respectively corrected by the plurality of correction units 105a, 105b and so forth, based on the center phase Pc and the plurality of boundary phases Pb detected by the plurality of phase detectors 106a, 106b and so forth, and output the levels. The equalizer selection circuit 1101 selects the level of either one of the levels output by the plurality of data decision units 107a, 107b and so forth, corresponding to the past data level stored in the storage unit 1102.

This embodiment is configured to preliminarily create data by adding the correction values corresponded to all possible cases, and to detect phase and to determine data for all data, rather than feeding back the correction value generated based on the past data and by adding it to the input data. FIG. 11 exemplifies the equalizer of a single-tap configuration, so that $2^1=2$ correction values (+d and −d) are generated and added to the input data. Upon completion of output of decision values corresponded to all corrected data, an output of the path, through which an appropriate correction value has been added corresponding to the past data, is selected as a correct decision value, and is output. In the full-rate design in which the decision is made at a frequency same as the data rate, the output is selected by the selection circuit which selects one of the two input data based on the past data.

Figure 12A:
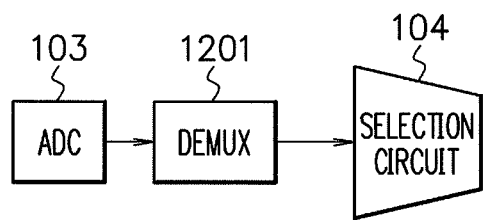
FIG. 12A is a drawing illustrating an exemplary configuration of a part of the receiving circuit of the second embodiment.

FIG. 12A is a drawing illustrating an exemplary configuration of a part of the receiving circuit of this embodiment. A demultiplexor 1201 is provided between the analog-digital converter 103 and the selection circuit 104. The demultiplexor 1201 is an 1:16 demultiplexor, and converts a serial data output by the analog-digital converter 103 into 16-bit-wide parallel digital data, at a clock frequency of 312.5 MHz for example.

Figure 12B:
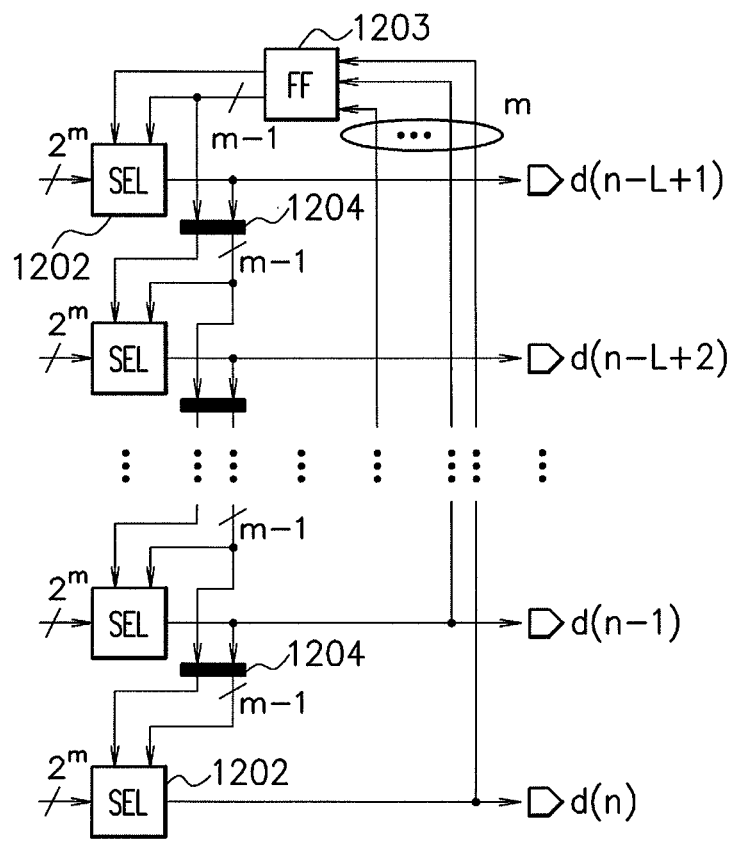
FIG. 12B is a drawing illustrating an exemplary configuration of an equalizer selection circuit illustrated in FIG. 11.

FIG. 12B is a drawing illustrating an exemplary configuration of the equalizer selection circuit 1101 illustrated in FIG. 11. The equalizer selection circuit 1101 has a selector 1202, a flipflop 1203 and a selector 1204, and can process data of m-tap equalizer in an L-bit parallel manner. If the operating frequency of the data decision units 107a, 107b equals to 1/L of the data rate frequency, the data decision units 107a, 107b and so forth output L parallel bit data. L selectors 1202 make selection from the decision values added with $2^m$ different correction values corresponding to m past data series. Since the past data series for controlling the selector 1202 employ the decision values which precede the currently focused bit, so that it is necessary to ensure "propagation of decision value" such that a decision value at a certain bit is always used for selection of the equalizer at the next bit.

Third Embodiment

Figure 13:
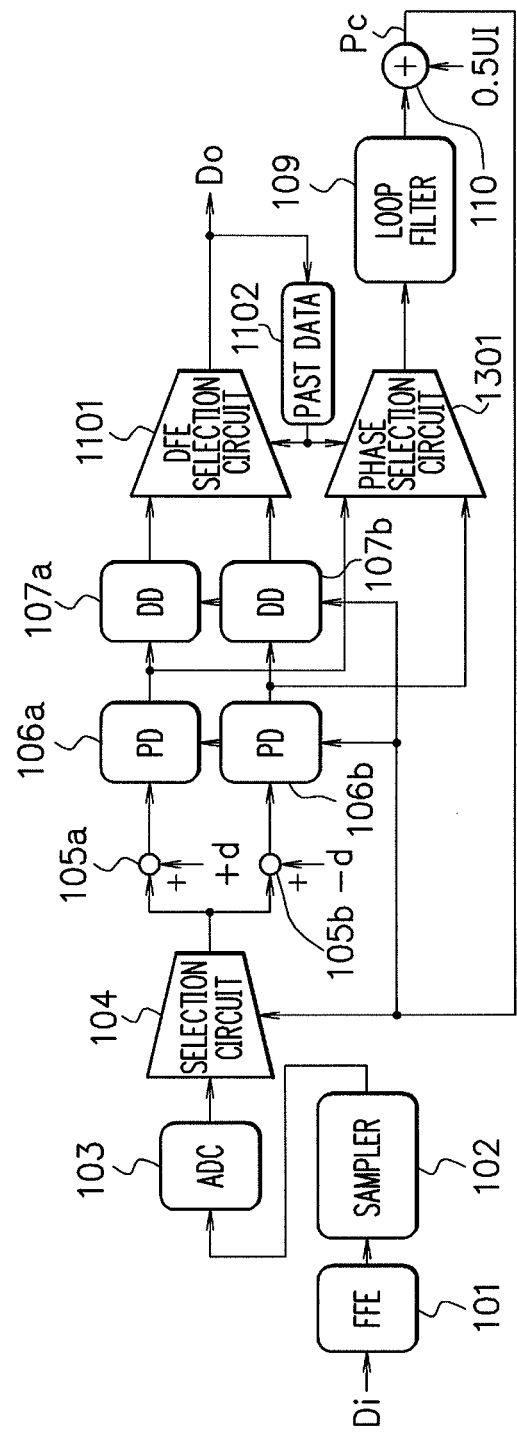
FIG. 13 is a drawing illustrating an exemplary configuration of a receiving circuit of a third embodiment.

FIG. 13 is a drawing illustrating an exemplary configuration of a receiving circuit of a third embodiment. Aspects of this embodiment different from those in the second embodiment will be explained below. In this embodiment (FIG. 13), a phase selection circuit 1301 is provided in place of the first phase detector 106c in the second embodiment (FIG. 11). The phase selection circuit 1301 selects either one of the boundary phases Pd detected by the phase detectors 106a, 106b, and outputs the selected one, based on the past data level stored in the storage unit 1102. The loop filter 109 smoothens the boundary phase Pb output by the phase selection circuit 1301, and outputs the smoothened boundary phase. The adder 110 adds 0.5 [UI] to the boundary phase output by the loop filter 109, and outputs the sum as the center phase Pc.

The phase selection circuit 1301 selects the boundary phase based on the past data stored in the storage unit 1102, similarly to the equalizer selection circuit 1101. In this way, the boundary phase Pb detected based on appropriately corrected data may be output to the loop filter 109, and this is advantageous enough to improve output accuracy of the loop filter 109.

Fourth Embodiment

FIG. 14 is a drawing illustrating an exemplary configuration of a receiving circuit of a fourth embodiment. Aspects of this embodiment different from those in the second embodiment will be explained below. This embodiment (FIG. 14) is understood as an exemplary case where the first phase detector 106c was omitted from the second embodiment (FIG. 11). The loop filter 109 smoothens the boundary phase Pb detected by the phase detector 106a, and outputs the smoothened boundary phase. The adder 110 adds 0.5 [UI] to the boundary phase output by the loop filter 109, and outputs the sum as the center phase Pc.

The loop filter 109 may alternatively be configured so as to receive the boundary phase Pb detected by the phase detector 106b, not by the phase detector 106a. It suffices that the loop filter 109 smoothens the boundary phase Pb detected by either one of the phase detectors 106a, 106b.

While the boundary phase Pb biased to a certain degree is input to the loop filter 109 in this embodiment, it has experimentally been proven that, by averaging the boundary phase Pb using the loop filter 109, the average boundary phase may be obtained almost without bias. The reason why the average value is not biased is that change in the input data from −1 to +1, and change from +1 to −1 occurs with almost equal probability, so that the same past data cause phase shifting by an equal value and different signs for the individual cases. In short, averaging can yield the average phase without bias. This embodiment is advantageous over the second embodiment, in that the number of phase detectors to be employed may be reduced, and thereby the amount of hardware may be reduced.

Fifth Embodiment

Figure 15:
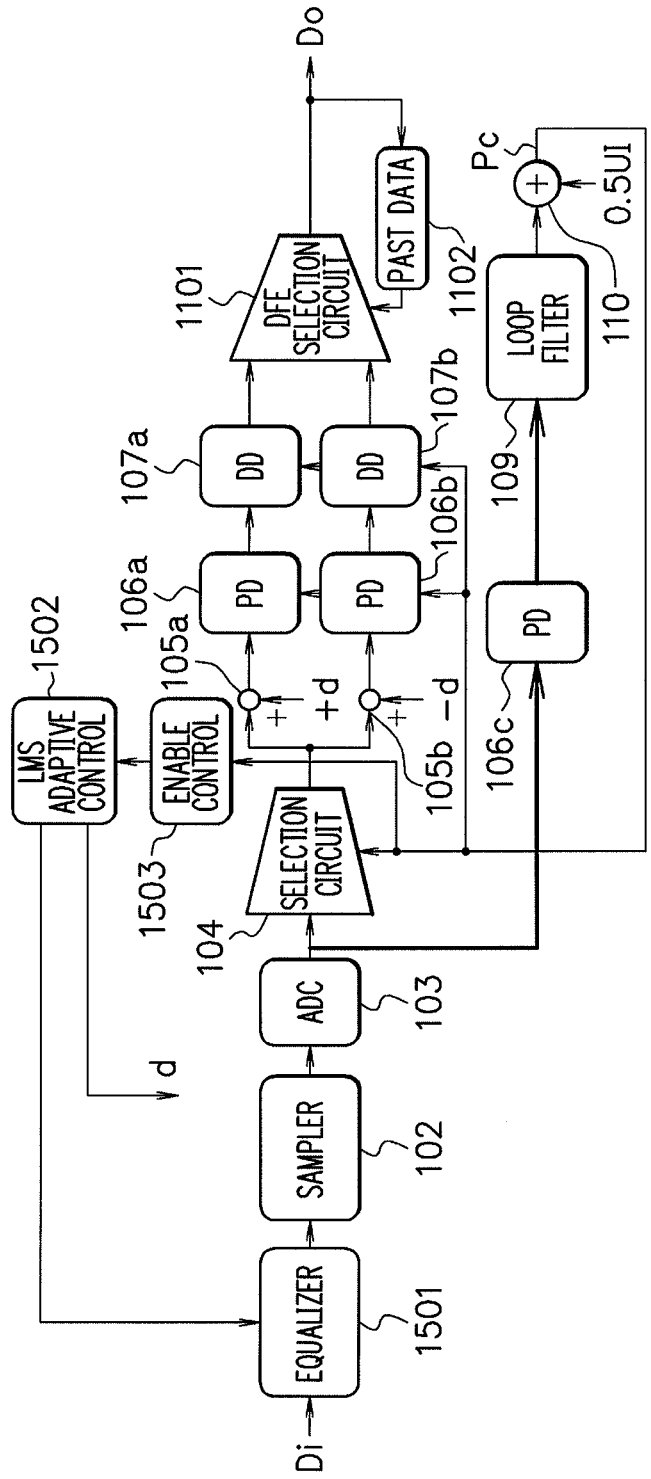
FIG. 15 is a drawing illustrating an exemplary configuration of a receiving circuit of a fifth embodiment.

FIG. 15 is a drawing illustrating an exemplary configuration of a receiving circuit of a fifth embodiment. Aspects of this embodiment different from those in the second embodiment will be explained. This embodiment (FIG. 15) is understood as an exemplary case where an equalizer 1501 is provided in place of the equalizer 101 in the second embodiment (FIG. 11), and where an enable control circuit 1503 and a least mean square (LMS) adaptive control circuit 1502 are additionally provided. The enable control circuit 1503 outputs an enable signal to the LMS adaptive control circuit 1502, based on the center phase Pc. The LMS adaptive control circuit 1502 calculates a tap coefficient and the correction value d of the equalizer 1501, when the enable signal is activated, and outputs the tap coefficient to the equalizer 1501.

Figure 16:
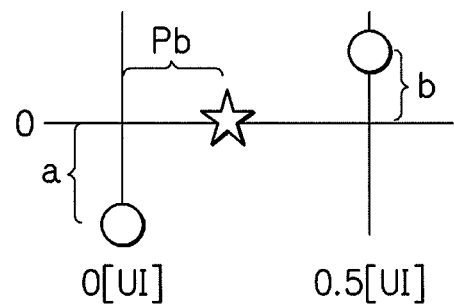
FIG. 16 is a drawing explaining a method of phase detection implemented by a phase detector illustrated in FIG. 15.

FIG. 16 is drawing explaining a method of detecting phase by the phase detectors 106a to 106c illustrated in FIG. 15. Assuming now that the level of input data a changes with a predetermined slope SL to the level of input data b, the phase detectors 106a to 106c respectively detects the boundary phase Pb at which the level of input data changes. If the absolute value |a| of a is not larger than the absolute value |b| of b, the boundary phase Pb is given as Pb=|a|/SL. In contrast, if the absolute value |a| of a is larger than the absolute value |b| of b, the boundary phase Pb is given as Pb=0.5 [UI]−|b|/SL. The equalizer 1501 illustrated in FIG. 15 is controlled so as to allow the input data to change with the predetermined slope SL. The equalizer 1501 equalizes the input data Di so as to allow the level of input data to change with the predetermined slope SL. A method of controlling of the equalizer 1501 will be described later.

Figure 17:
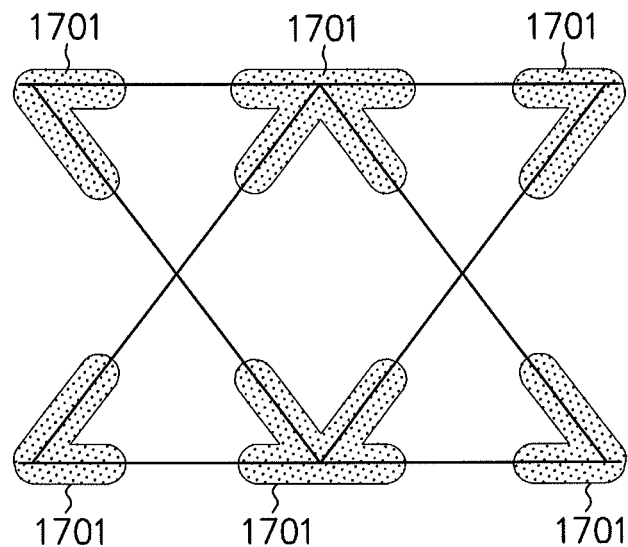
FIG. 17 is a drawing illustrating changes in input data controlled by an equalizer illustrated in FIG. 15.

FIG. 17 is a drawing illustrating changes in the input data controlled by the equalizer 1501 illustrated in FIG. 15. The input data is controlled so as to give a diamond-like waveform according to which the input data changes with the predetermined slope SL. The enable control circuit 1503 illustrated in FIG. 15 inactivates the enable signal in a 0.2 [UI] area containing the boundary phase Pb at which the input data changes, whereas it activates the enable signal in the other area 1701. Since the area 1701 shows no decay in the data change waveform, so that the LMS adaptive control circuit 1502 performs adaptive control only in the area 1701.

Figure 18:
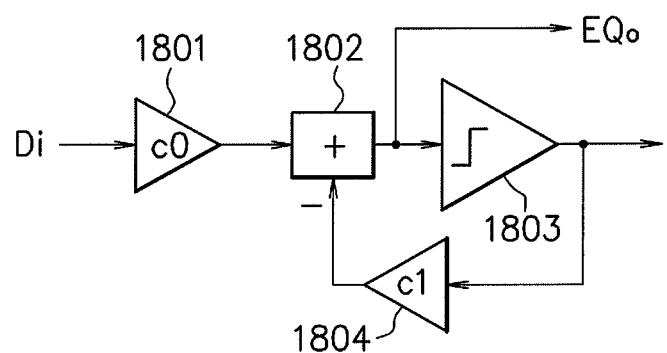
FIG. 18 is drawing illustrating an exemplary configuration of the equalizer illustrated in FIG. 15.

FIG. 18 is a drawing illustrating an exemplary configuration of the equalizer 1501 illustrated in FIG. 15. The multiplier 1801 multiplies the input data Di and the tap coefficient c0, and outputs the product. A subtractor 1802 subtracts an output value of a multiplier 1804 from the output value of the multiplier 1801, and outputs data EQo to the sampler 102 illustrated in FIG. 15. A decision circuit 1803 decides a binary code of the data EQo, and outputs "+1" or "−1". The multiplier 1804 multiplies the output value of the decision circuit 1803 and a tap coefficient c1, and outputs the product to the subtractor 1802.

Figure 19:
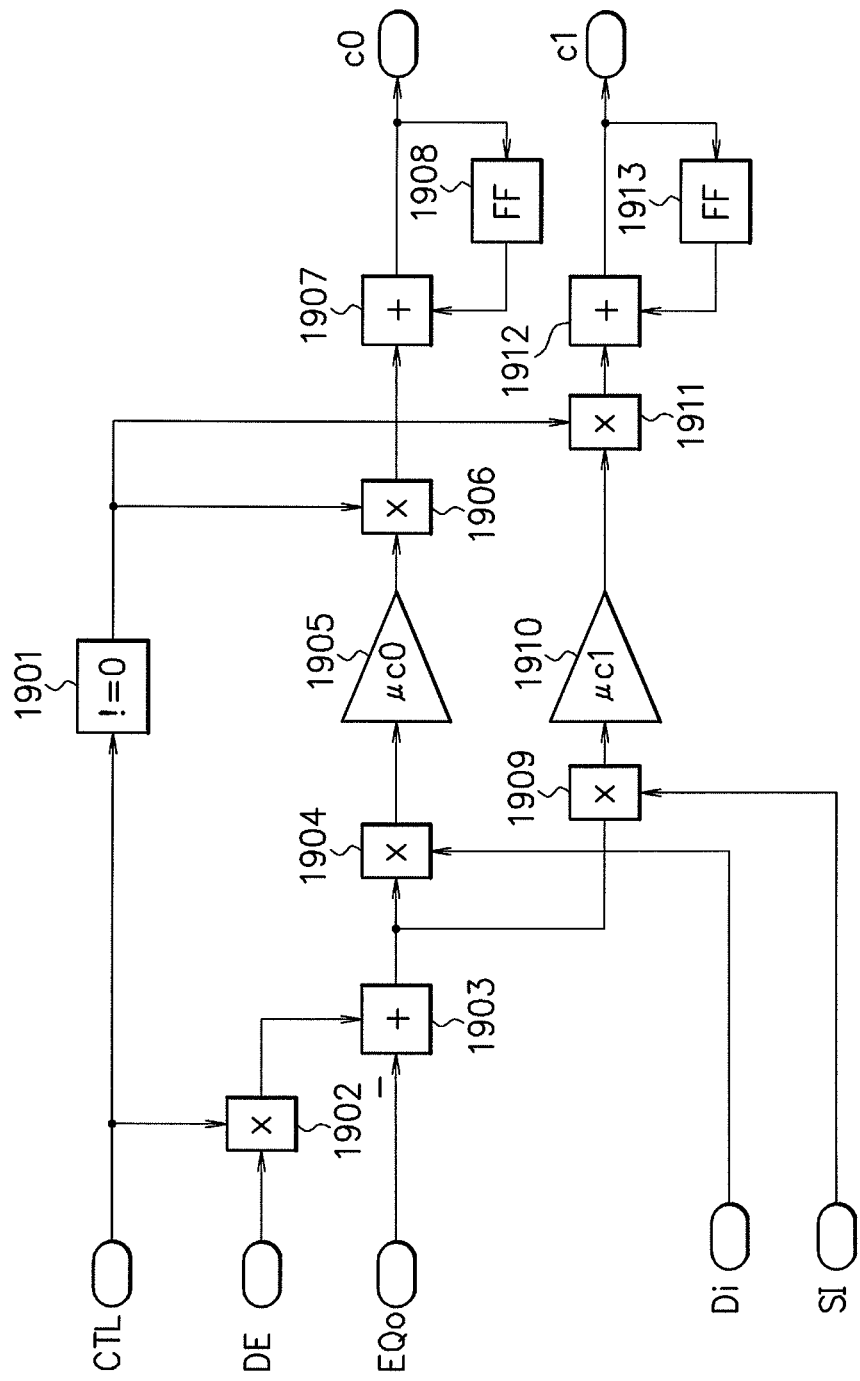
FIG. 19 is a drawing illustrating an exemplary configuration of an LMS adaptive control circuit illustrated in FIG. 15.

FIG. 19 is a drawing illustrating an exemplary configuration of the LMS adaptive control circuit 1502 illustrated in FIG. 15. Enable signal CTL is an output signal of the enable control circuit 1503 illustrated in FIG. 15. Expected value DE is an output data of the decision circuit 1803 illustrated in FIG. 18, and has a value of "+1" or "−1". Sign SI is a sign of input data Di.

A multiplier 1902 multiplies the expected value DE and the enable signal CTL, and outputs the product. A subtractor 1903 subtracts the data EQo from the output value of the multiplier 1902, and outputs an error. A multiplier 1904 multiplies the error output by the subtractor 1903 and the input data Di, and outputs the product. A multiplier 1909 multiplies the error output by the subtractor 1903 and the sign SI, and output the product. A multiplier 1905 multiplies the output value of the multiplier 1904 and a coefficient $\mu c0$, and outputs the product. A multiplier 1910 multiplies the output value of the multiplier 1909 and a coefficient $\mu c1$, and outputs the product.

A logic circuit 1901 outputs 1 to multipliers 1906 and 1911 if the enable signal CTL is not 0, whereas outputs 0 to the multipliers 1906 and 1911 if the enable signal CTL is 0. The multiplier 1906 multiplies the output values of the multipliers 1905 and logic circuit 1901, and outputs the product. The multiplier 1911 multiplies the output values of the multiplier 1910 and the output value of the logic circuit 1901, and outputs the product. An adder 1907 adds the output value of the multiplier 1906 and an output value of a flipflop 1908, and outputs the tap coefficient c0 to the equalizer illustrated in FIG. 18. An adder 1912 adds the output value of the multiplier 1911 and an output value of a flipflop 1913, and outputs the tap coefficient c1 to the equalizer illustrated in FIG. 18. The equalizer illustrated in FIG. 18 has the tap coefficients c0 and c1 set thereon. The flipflop 1908 stores the tap coefficient c0 output by the adder 1907. The flipflop 1913 stores the tap coefficient c1 output by the adder 1912.

This embodiment is different from the second embodiment in the configuration of the phase detectors 106a, 106b, and in that the LMS adaptive control circuit 1502 is additionally provided. The phase detectors 106a and 106b calculate the boundary phase Pb based on the predetermined slope SL, as illustrated in FIG. 16. If the slope SL of the data waveform during change is constant, the sample value itself represents the phase, and thereby the phase detectors 106a and 106b may be simplified to a considerable degree.

Note that this method requires constancy of the slope SL during the data change, and this is controlled by the LMS adaptive control circuit 1502. The LMS adaptive control circuit 1502 uses an LMS algorism to adjust the tap coefficients c0 and c1 so as to minimize the difference between the data EQo and the desired expected value DE.

The enable control circuit 1503 determines whether the control by the LMS adaptive control circuit 1502 will be implemented or not. This is for the purpose of preventing the accuracy of adaptive control from degrading depending on the range of phase. For example, the adaptive control may be stabilized by implementing it not in the 0.2 [UI] area which contains the boundary phase Pb, but in the other area 1701.

FIG. 20 is a drawing illustrating results of simulation of the receiving circuit of the fifth embodiment. The abscissa represents jitter frequency, and the ordinate represents jitter amplitude. A characteristic curve 2001 represents characteristics of the receiving circuit illustrated in FIG. 15. A characteristic curve 2002 represents characteristics of a receiving circuit using a general phase detector and an LMS algorism. It is understood that this embodiment represented by the characteristic curve 2001 can achieve characteristics comparable to those of the configuration represented by the characteristic curve 2002, even if the phase detectors 106a and 106b were simplified.

As described in the above, according to the first to fifth embodiments, the decision feedback equalizer 111 may be implemented with a smaller amount of hardware. As a consequence, performance of equalization may be improved, and thereby larger channel loss may be compensated with a smaller number of bits of the analog-digital converter 103. In addition, since the correction value generating circuit 108 generates a predetermined correction value irrespective of phase, so that the amount of hardware may be reduced. Reduction in the amount of hardware of the analog-digital converter 103 and the digital circuit yields an effect of reducing occupied space and power consumption of the receiving circuit. In short, the first to fifth embodiments enable highly accurate decoding of data only with a less amount of hardware, and implement space saving and power saving.

The present invention enables highly accurate decoding of data only with a less amount of hardware, and implement space saving and power saving.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A receiving circuit comprising:
    a data selection circuit selecting two sampling points between which a center phase of one unit interval of a binary input data is located;
    a correction circuit correcting the two sampling points selected by the data selection circuit;
    a phase detection circuit detecting a phase at which a level of the two sampling points changes as a boundary phase in the one unit interval, based on the two sampling points corrected by the correction circuit;
    an arithmetic unit calculating the center phase of the one unit interval, based on either the boundary phase detected by the phase detection circuit or a first phase detector detecting a phase at which a level of the binary input data changes as a boundary phase in the one unit interval; and
    a data decision circuit determining and outputting the level of one of the two sampling points, based on the center phase and the boundary phase,
    the data selection circuit selecting the two sampling points based on the center phase calculated by the arithmetic unit, and
    the correction circuit correcting the two sampling points based on a correction value corresponding to a past data level output by the data decision circuit.

2. The receiving circuit according to claim 1,
    wherein the arithmetic unit includes a low pass filter, and is configured to output a smoothened center phase.

3. The receiving circuit according to claim 1,
    wherein the correction circuit has a plurality of correction units correcting the two sampling points based on a plurality of correction values,
    the phase detection circuit has a plurality of phase detectors each detecting a phase at which the level of the two sampling points changes as a boundary phase in the one unit interval, based on the two sampling points corrected by each of the plurality of correction units,
    the data decision circuit has a plurality of data decision units each determining and outputting the level of either one of the two sampling points corrected by each of the plurality of correction units, based on the center phase and each of the plurality of boundary phases detected by the plurality of phase detectors, and
    the receiving circuit further comprises an equalizer selection circuit selecting and outputting either one level of data out of the levels of data output by the plurality of data decision units.

4. The receiving circuit according to claim 3, wherein the arithmetic unit calculates the center phase based on the boundary phase detected by the first phase detector.

5. The receiving circuit according to claim 3, further comprising:
    a phase selection circuit selecting and outputting any one boundary phase out of the plurality of boundary phases detected by the plurality of phase detectors, corresponding to the past data level output by the equalizer selection circuit, and
    the arithmetic unit calculates the center phase, based on the boundary phase output by the phase selection circuit.

6. The receiving circuit according to claim 3,
    wherein the arithmetic unit calculates the center phase, based on the boundary phase detected by any one of the plurality of phase detectors.

7. The receiving circuit according to claim 1,
    wherein the phase detection circuit detects the phase at which the level of the two sampling points changes, assuming that a level of the binary input data changes with a predetermined slope, and
    the receiving circuit further comprises an equalizer equalizing the binary input data so that the level thereof changes with the predetermined slope, and outputting the result to the data selection circuit.

* * * * *